(12) United States Patent
Lee et al.

(10) Patent No.: US 7,935,977 B2
(45) Date of Patent: May 3, 2011

(54) METHOD OF MANUFACTURING ORGANIC LIGHT EMITTING DEVICE AND ORGANIC LIGHT EMITTING DEVICE MANUFACTURED BY USING THE METHOD

(75) Inventors: Jung-Hyoung Lee, Daejeon Metropolitan (KR); Jae-Seung Lee, Daejeon Metropolitan (KR); Jung-Bum Kim, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 88 days.

(21) Appl. No.: 12/309,614

(22) PCT Filed: Jul. 25, 2007

(86) PCT No.: PCT/KR2007/003570
§ 371 (c)(1),
(2), (4) Date: Apr. 13, 2009

(87) PCT Pub. No.: WO2008/013402
PCT Pub. Date: Jan. 31, 2008

(65) Prior Publication Data
US 2009/0321764 A1    Dec. 31, 2009

(30) Foreign Application Priority Data

Jul. 25, 2006 (KR) ............... 10-2006-0069978
Jul. 25, 2006 (KR) ............... 10-2006-0069979

(51) Int. Cl.
*H01L 51/52* (2006.01)
*H01L 51/56* (2006.01)

(52) U.S. Cl. ........... 257/98; 257/E51.018; 257/E21.159; 257/E21.219; 438/43

(58) Field of Classification Search .......... 257/98, 257/E51.018, E21.159, E21.219; 438/42, 438/43, 704, 706
See application file for complete search history.

(56) References Cited

U.S. PATENT DOCUMENTS

| | | | |
|---|---|---|---|
| 4,690,880 A * | 9/1987 | Suzuki et al. | 430/313 |
| 6,013,538 A * | 1/2000 | Burrows et al. | 438/22 |
| 6,495,198 B2 | 12/2002 | Peng | |
| 6,670,052 B2 | 12/2003 | Hirose et al. | |
| 6,786,632 B2 * | 9/2004 | Tanaka et al. | 374/31 |
| 6,797,129 B2 | 9/2004 | Raychaudhuri et al. | |
| 6,882,383 B1 | 4/2005 | Su | |
| 7,450,295 B2 * | 11/2008 | Tung et al. | 359/290 |

* cited by examiner

*Primary Examiner* — Benjamin P Sandvik
*Assistant Examiner* — W. Wendy Kuo
(74) *Attorney, Agent, or Firm* — McKenna Long & Aldridge LLP

(57) ABSTRACT

Disclosed is a method of manufacturing an organic light emitting device, an organic light emitting device manufactured by using the method, and an electronic device including the organic light emitting device. The method includes (a) forming an insulating layer on a lower electrode, (b) etching the insulating layer to form an opening ranging from an upper surface of the insulating layer to the lower electrode so that an overhang structure having a lowermost circumference that is larger than an uppermost circumference is formed, (c) forming a conductive layer on an upper surface of the lower electrode in the opening and a surface of the insulating layer other than the overhang structure, (d) forming an organic material layer on the conductive layer formed on the upper surface of the lower electrode in the opening, and (e) forming an upper electrode on an upper surface of the conductive layer disposed on the upper surface of the insulating layer and an upper surface of the organic material layer.

22 Claims, 8 Drawing Sheets

[Fig. 1]
Related Art
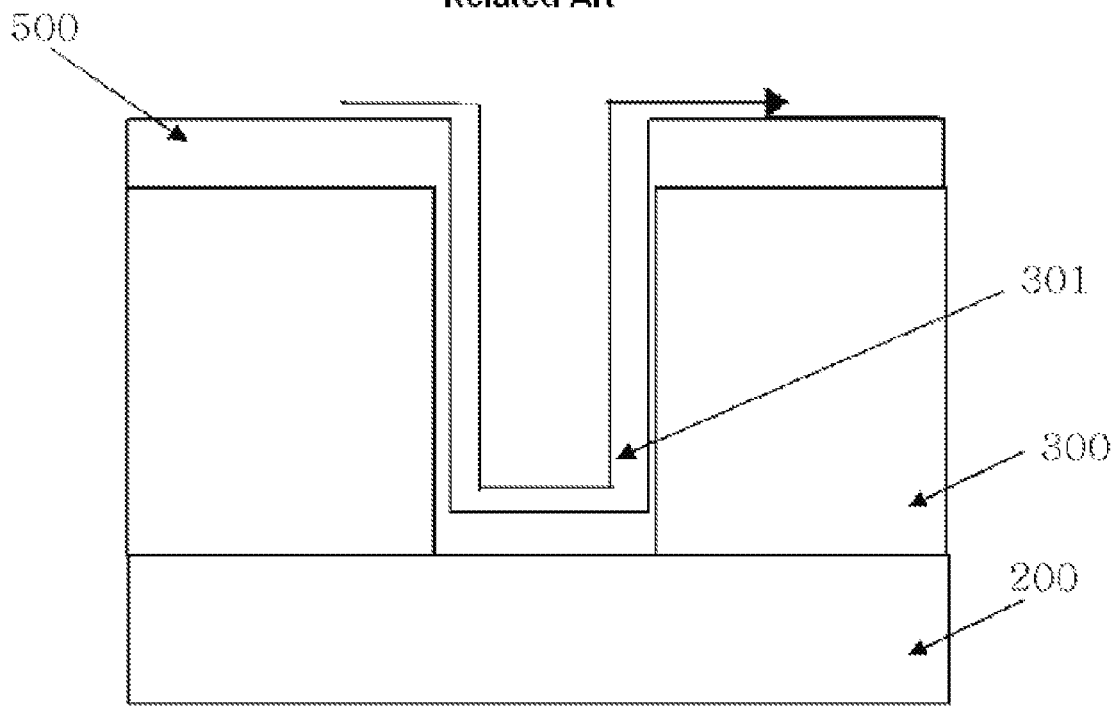
[Fig. 2]
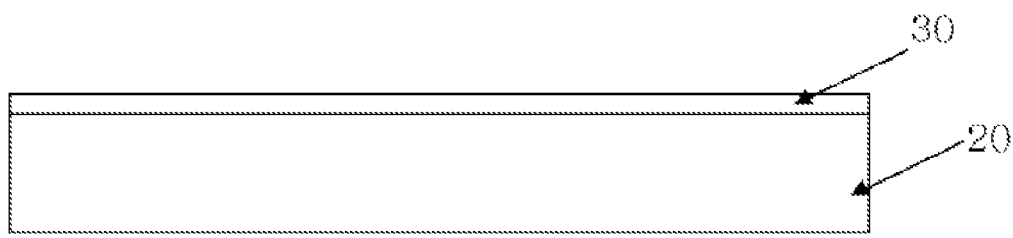
[Fig. 3]
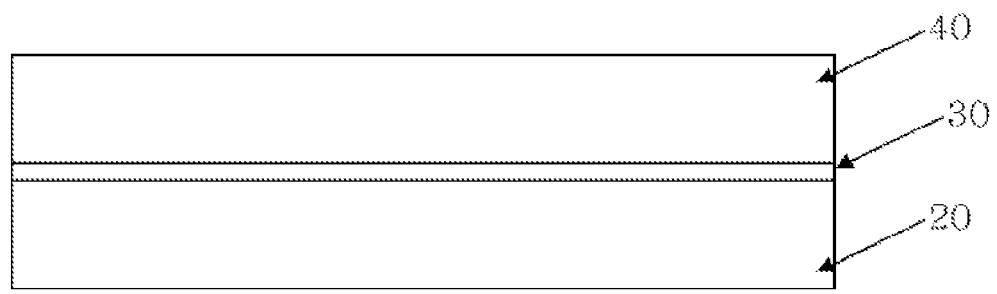

[Fig. 4]
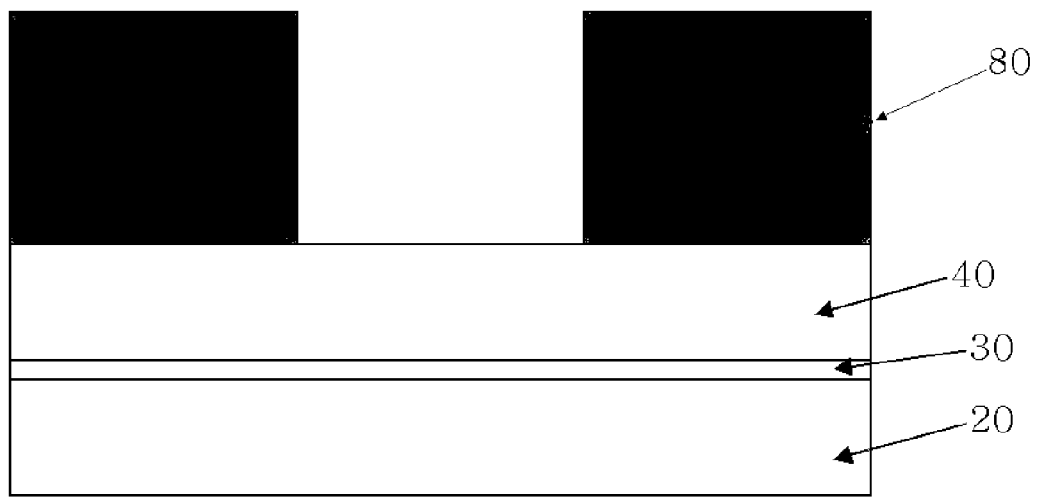
[Fig. 5]
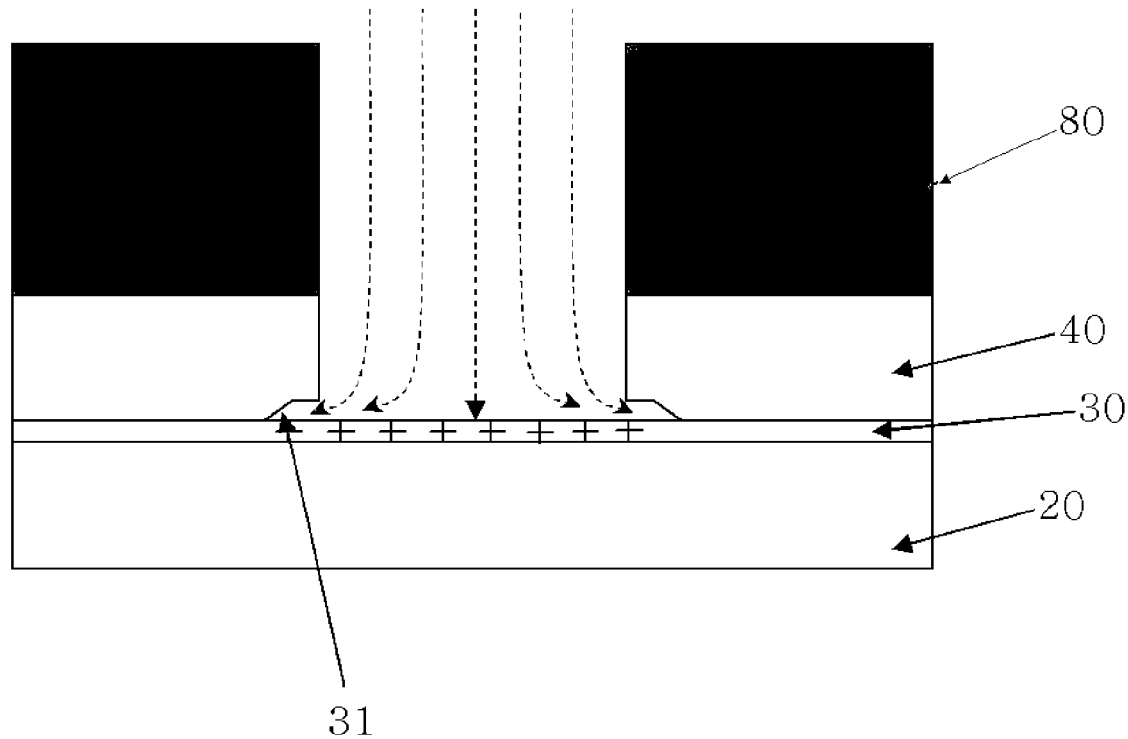

[Fig. 6]
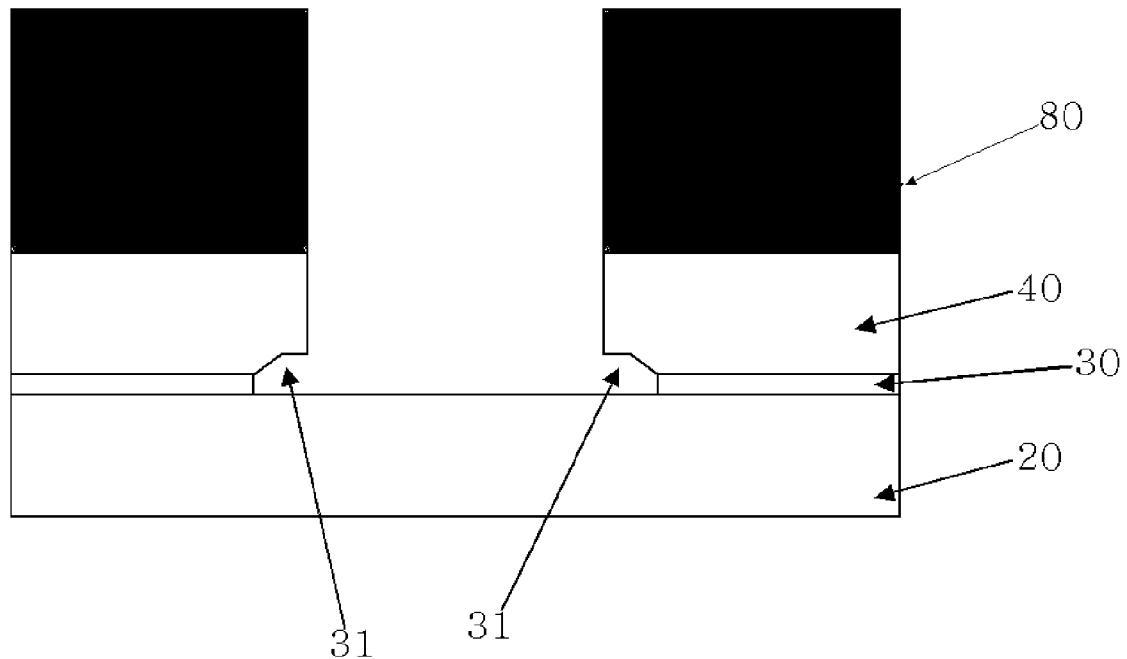
[Fig. 7]
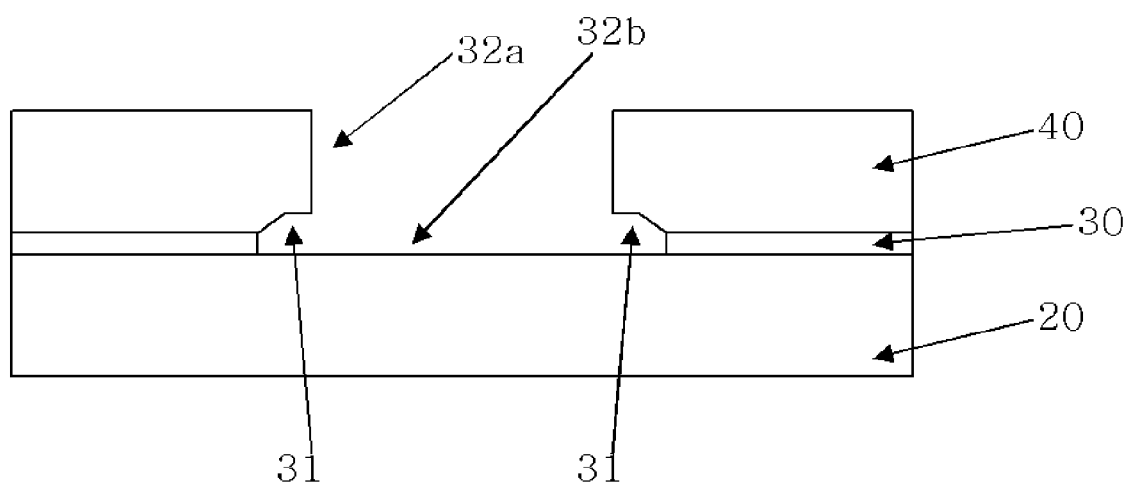

[Fig. 8]
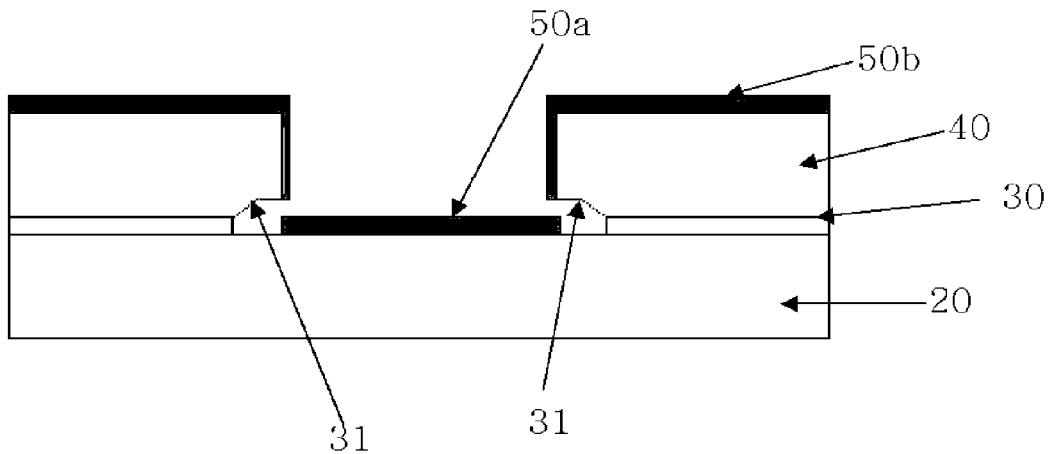
[Fig. 9]
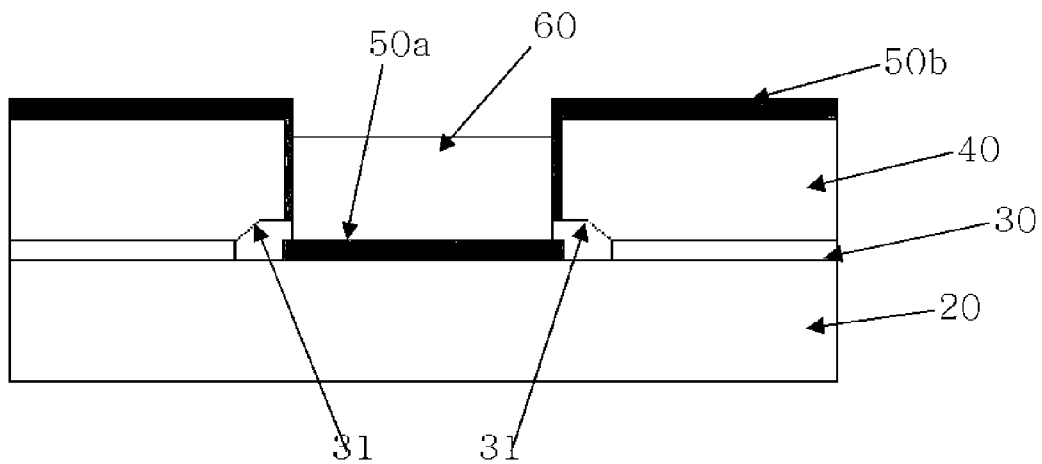
[Fig. 10]
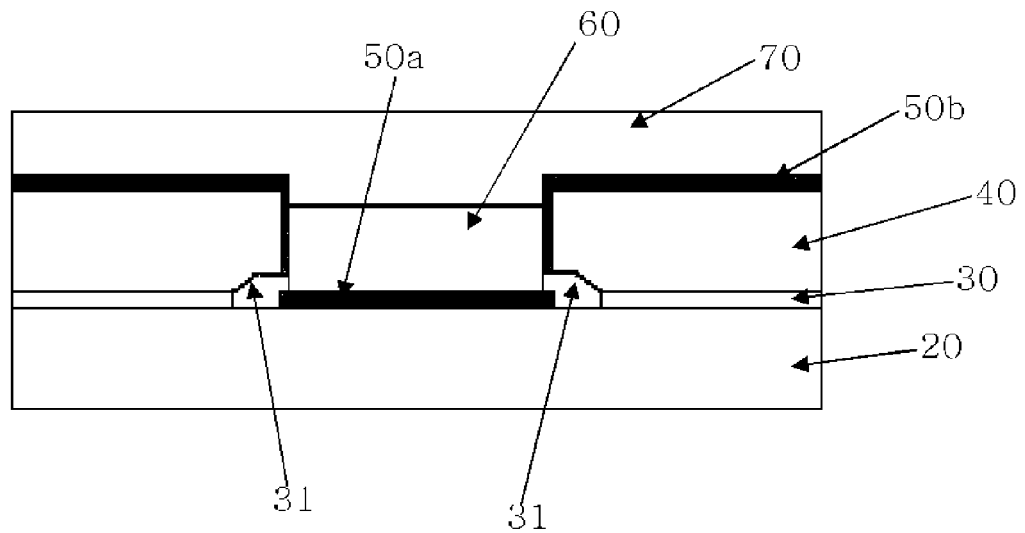

[Fig. 11]
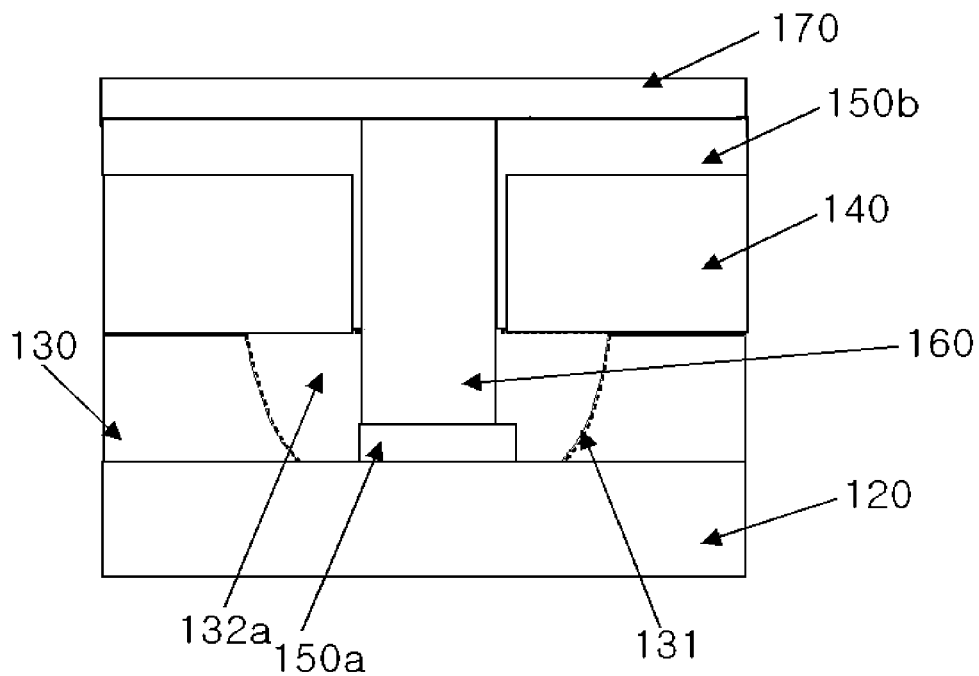
[Fig. 12]
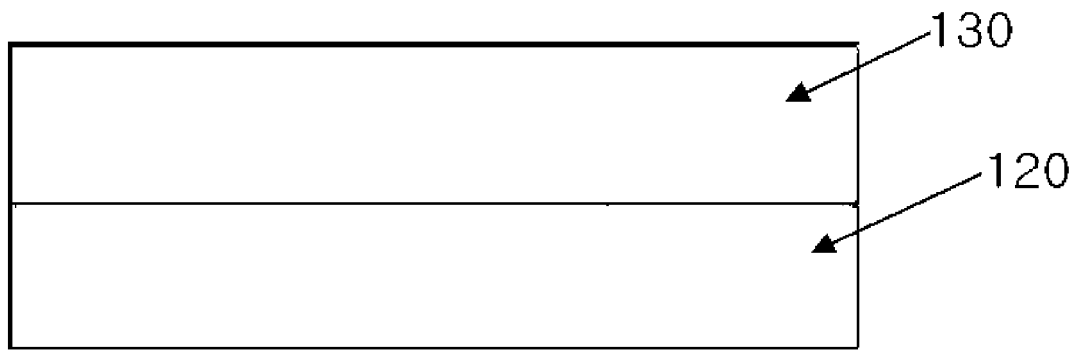
[Fig. 13]
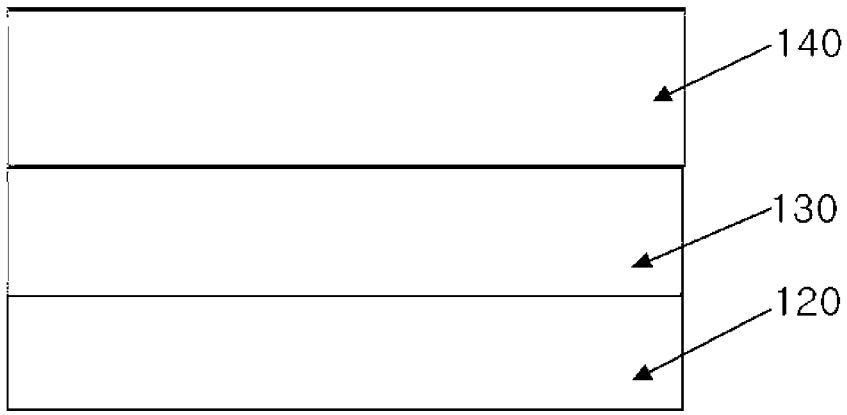

[Fig. 14]
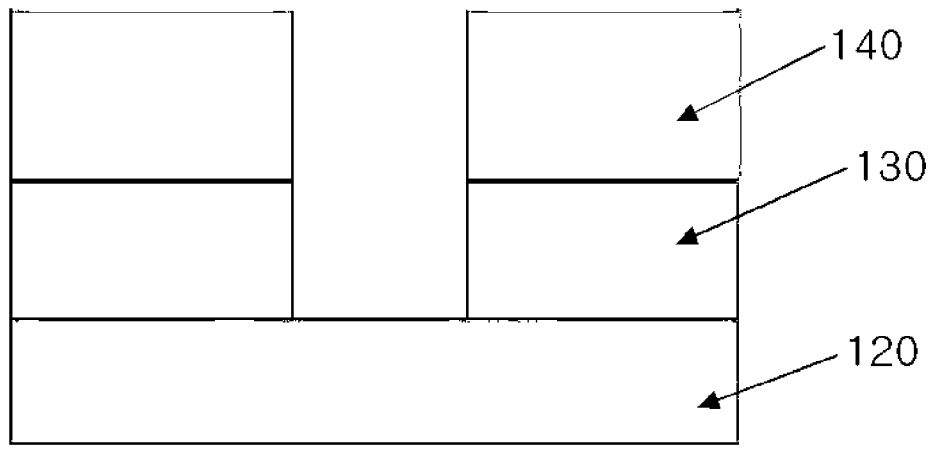
[Fig. 15]
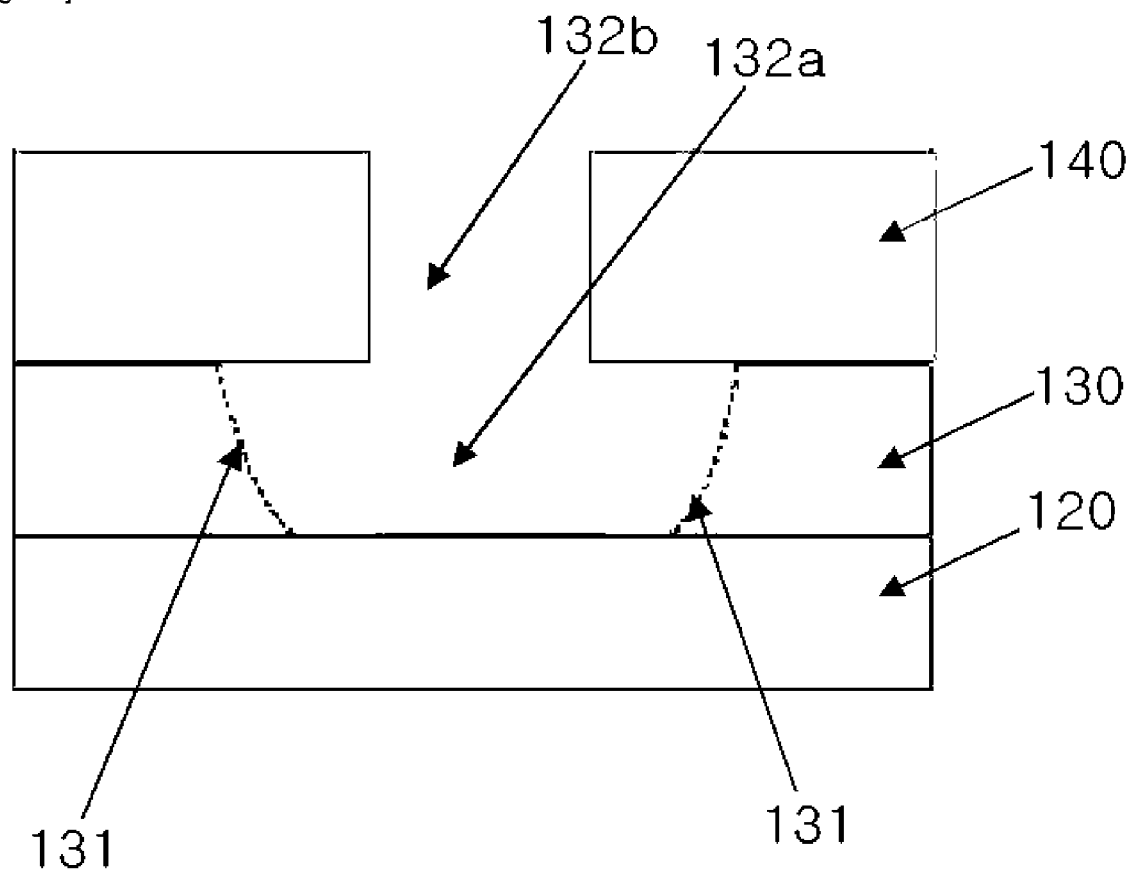

[Fig. 16]
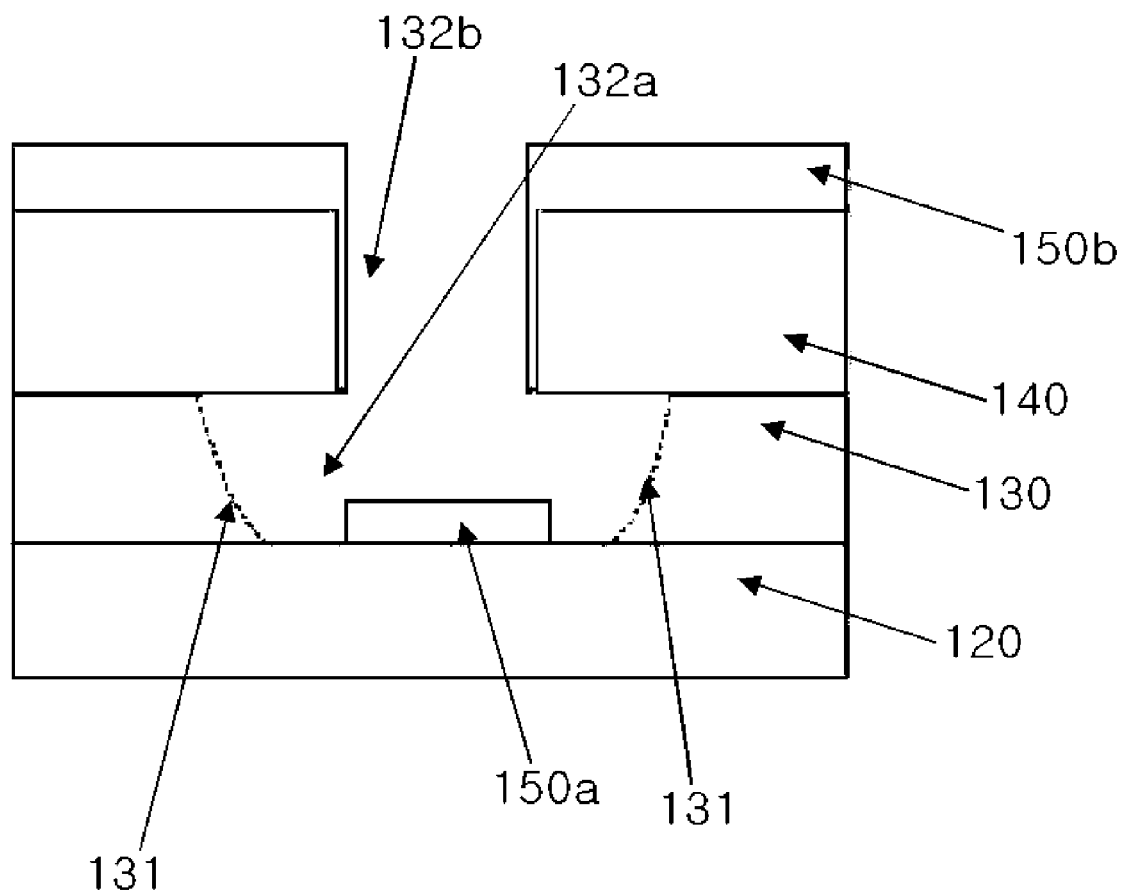
[Fig. 17]
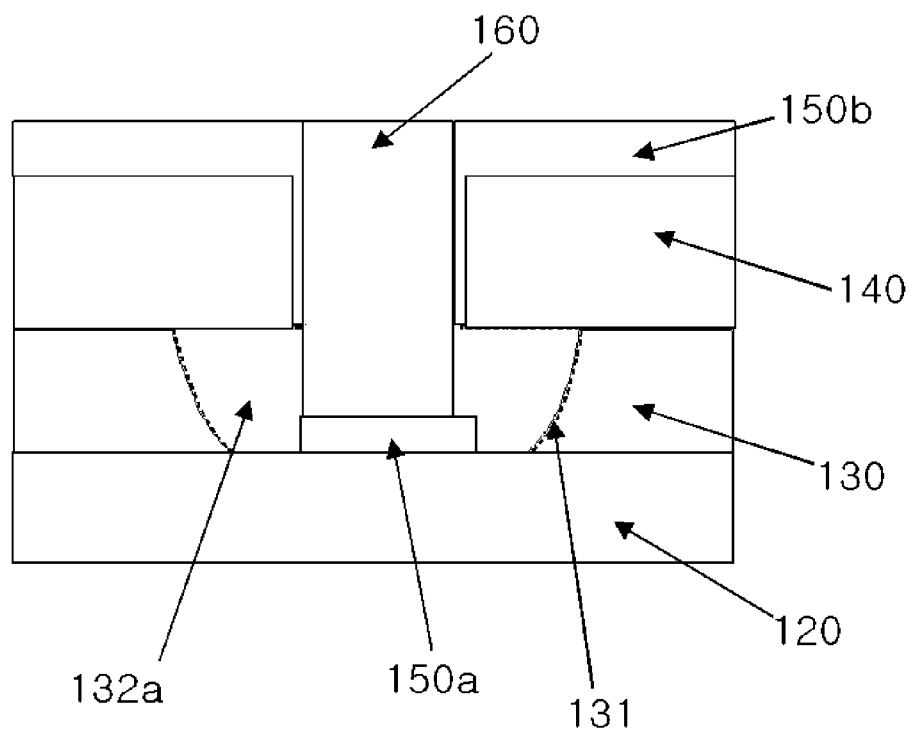

[Fig. 18]
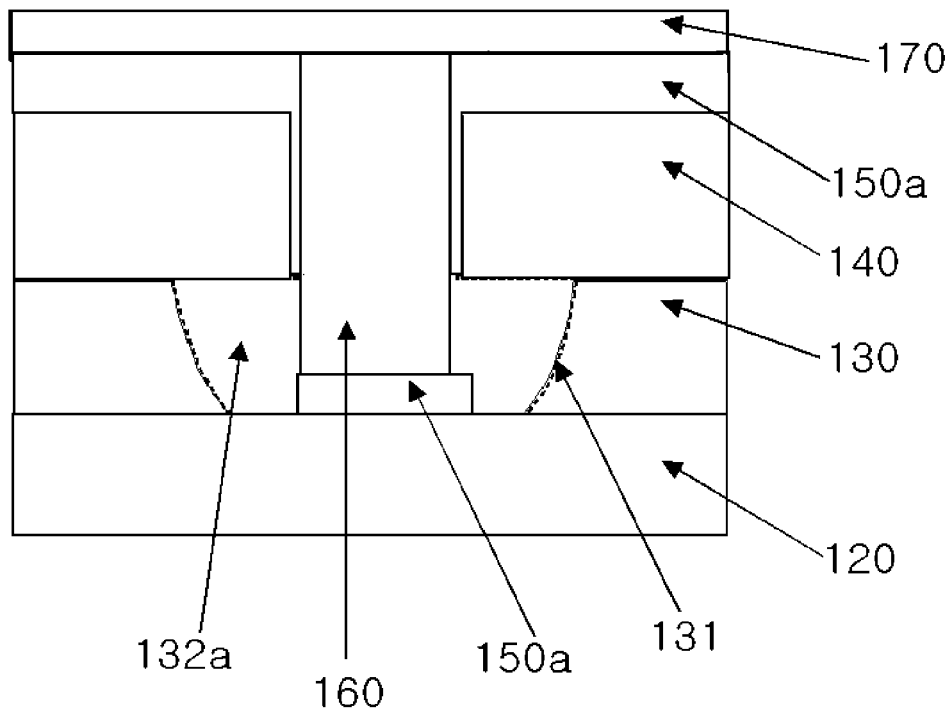
[Fig. 19]
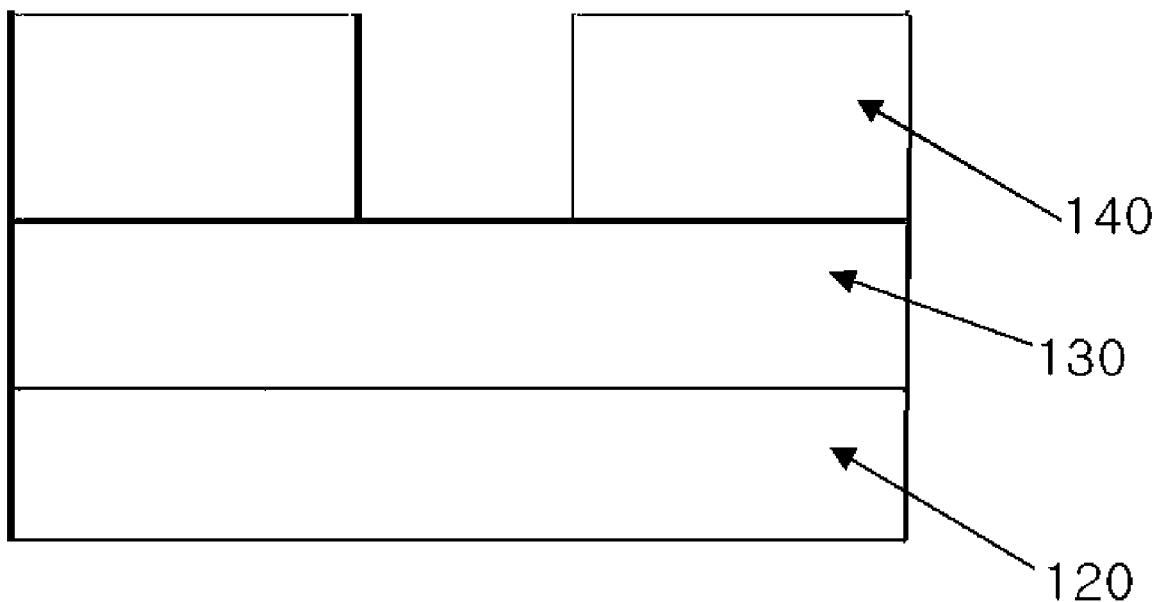

METHOD OF MANUFACTURING ORGANIC LIGHT EMITTING DEVICE AND ORGANIC LIGHT EMITTING DEVICE MANUFACTURED BY USING THE METHOD

This application claims priority to PCT/KR2007/003570 filed on Jul. 25, 2007 with Korean Patent Application No. 10-2006-0069978 filed on Jul. 25, 2006 and Korean Patent Application No. 10-2006-0069979 filed on Jul. 25, 2006, both of which contents are hereby incorporated by reference in their entirety.

TECHNICAL FIELD

The present invention relates to a method of manufacturing an organic light emitting device having an overhang structure that is capable of preventing a leakage current from flowing along a surface direction of a conductive layer in the organic light emitting device containing the conductive layer, an organic light emitting device manufactured by using the method, and an electronic device including the organic light emitting device.

This application claims priority from Korea Patent Application Nos. 10-2006-0069978 and 10-2006-0069979, each filed on Jul. 25, 2006 in the KIPO, each disclosure of which is incorporated herein by reference in its entirety.

BACKGROUND ART

An organic light emitting device using organic light emission is applied to various types of illuminating devices because of an advantage of high luminance at low voltage, and has advantages of driving at low voltage, lightness and slimness, a wide viewing angle, and high-speed response, accordingly, the organic light emitting device is frequently applied to display devices.

The organic light emission means that electric energy is converted into light energy by using an organic material. That is, in the case where an organic material layer is disposed between an anode and a cathode, if voltage is applied between two electrodes, a hole is injected into the organic material layer at the anode and an electron is injected into the organic material layer at the cathode. When the hole meets the electron, an exciton is generated, and light is generated when the exciton is converted into a bottom state.

As shown in FIG. 1, a known organic light emitting device includes a substrate (not shown); a lower electrode 200 that is formed on the substrate (not shown); an insulating layer 300 that is formed on the lower electrode 200 and has an opening 301 corresponding to a substantial light emission area; a conductive layer 500 that is formed on a portion of an upper surface of the lower electrode 200 corresponding in position to the opening 301 and on an entire surface of the insulating layer 300; an organic material layer (not shown) that is formed on a portion of an upper surface of the conductive layer 500 corresponding in position to the opening 301; and an upper electrode (not shown) that is formed on a portion of the upper surface of the conductive layer 500 and a portion of an upper surface of the organic material layer (not shown) formed on the upper surface of the insulating layer 300.

In this connection, the single opening 301 forms one light emitting pixel, and a plurality of light emitting pixels having the same shape is formed on the lower electrode 200.

However, in the case of the known organic light emitting device, if power is applied to drive the organic light emitting device, as shown in FIG. 1, a leakage current flows in the direction of the arrow. That is, there is a problem in that the leakage current flows along the surface direction of the conductive layer 500 and is provided into the undesired light emitting pixel, causing lighting of undesired light emitting pixel.

DISCLOSURE OF INVENTION

Technical Problem

It is an object of the present invention to provide a method of manufacturing an organic light emitting device having an overhang structure that is capable of preventing a leakage current from flowing along a surface direction of a conductive layer in the organic light emitting device containing the conductive layer, an organic light emitting device manufactured by using the method, and an electronic device including the organic light emitting device.

Technical Solution

In order to achieve the above object, an embodiment of the present invention provides a method of manufacturing an organic light emitting device. The method includes (a) forming an insulating layer on a lower electrode, (b) etching the insulating layer to form an opening ranging from an upper surface of the insulating layer to the lower electrode so that an overhang structure having a lowermost circumference that is larger than an uppermost circumference is formed, (c) forming a conductive layer on an upper surface of the lower electrode in the opening and a surface of the insulating layer other than the overhang structure, (d) forming an organic material layer on the conductive layer formed on the upper surface of the lower electrode in the opening, and (e) forming an upper electrode on an upper surface of the conductive layer disposed on the surface of the insulating layer and an upper surface of the organic material layer.

Another embodiment of the present invention provides an organic light emitting device that includes a lower electrode, an insulating layer that is formed on the lower electrode and has an opening perpendicularly formed to a surface of the lower electrode, the opening having an overhang structure where a lowermost circumference is larger than an uppermost circumference, a conductive layer that is formed on an upper surface of the lower electrode in the opening and a surface of the insulating layer other than the overhang structure, an organic material layer that is formed on the conductive layer formed on the upper surface of the lower electrode in the opening, and an upper electrode that is formed on an upper surface of the conductive layer disposed on the surface of the insulating layer and an upper surface of the organic material layer.

Still another embodiment of the present invention provides an electronic device that includes the organic light emitting device.

Advantageous Effects

According to the present invention, a flowing path of a leakage current that flows along a surface direction of a conductive layer in the related art is blocked. Therefore, it is possible to prevent lighting of an undesired light emitting pixel caused by provision of the leakage current to the undesired light emitting pixel along the surface direction of the conductive layer.

Furthermore, an etching process is quickly performed through a simple procedure to form an overhang structure, and the size of overhang structure is easily controlled.

BRIEF DESCRIPTION OF THE DRAWINGS

FIG. 1 is a sectional view of a known organic light emitting device;

FIGS. 2 to 10 are views illustrating manufacturing of an organic light emitting device according to a first embodiment of the present invention;

FIG. 11 is a sectional view of an organic light emitting device according to a second embodiment of the present invention;

FIGS. 12 to 18 are views illustrating manufacturing of the organic light emitting device according to the second embodiment; and FIG. 19 is a view illustrating a dry etching area that is different from that of FIG. 14.

MODE FOR THE INVENTION

A detailed description of the present invention will be given hereinafter.

According to an embodiment of the present invention, a method of manufacturing an organic light emitting device includes (a) forming an insulating layer on a lower electrode, (b) etching the insulating layer to form an opening ranging from an upper surface of the insulating layer to the lower electrode so that an overhang structure having a lowermost circumference that is larger than an uppermost circumference is formed, (c) forming a conductive layer on an upper surface of the lower electrode in the opening and a surface of the insulating layer other than the overhang structure, (d) forming an organic material layer on the conductive layer formed on the upper surface of the lower electrode in the opening, and (e) forming an upper electrode on an upper surface of the conductive layer disposed on the surface of the insulating layer and an upper surface of the organic material layer.

Hereinafter, a method of manufacturing an organic light emitting device according to a first embodiment of the present invention will be described.

In the method of manufacturing the organic light emitting device according to the first embodiment of the present invention, the insulating layer may be a silicon insulating layer. Accordingly, in the method of manufacturing the organic light emitting device according to the first embodiment of the present invention, the silicon insulating layer is dry etched to form an opening ranging from an upper surface of the silicon insulating layer to the lower electrode so that an overhang structure having a lowermost circumference that is larger than an uppermost circumference is formed in step (b).

In this connection, before step (a), the method may further include a step of forming the lower electrode on the substrate, and the lower electrode may act as the substrate.

The step of forming the lower electrode on the substrate may be performed by using a method that is known in the related art. For example, the method may include (i) depositing a thin film on the substrate to form the lower electrode, and (ii) patterning the thin film to form the lower electrode on the substrate.

The substrate that is used during step (i) may be made of transparent plastics, or metal such as gold, silver, aluminum, and an alloy thereof.

The thin film that is patterned to form the lower electrode may be made of metal such as magnesium, calcium, sodium, potassium, titanium, indium, yttrium, lithium, gadolinium, aluminum, silver, tin, and lead, or an alloy thereof. Alternatively, the thin film may be made of transparent conducting oxides such as indium tin oxides (ITO), indium zinc oxides (IZO), and zinc oxides (ZnO). In the case where the present invention is applied to an organic light emitting device having an inverted structure, the lower electrode is made of the above-mentioned metal.

In order to form the lower electrode, the thin film may be formed by using an electrode formation process which is known in the related art such as a sputtering process, a thermal evaporation process, an atomic layer deposition process, a chemical vapor deposition process, and an e-beam evaporation process.

In step (ii), the thin film is wet etched or dry etched using a resist pattern as a mask to be patterned, thereby forming the lower electrode. In this connection, the resist pattern may be formed by using a lithography process.

Additionally, between the step of forming the lower electrode on the substrate and step (a), that is, before the silicon insulating layer is formed on the lower electrode, a step of forming an oxide film on the lower electrode may be further included.

The oxide film functions to protect the lower electrode when the silicon insulating layer is dry etched during step (b) and to increase formation of a notch as described later during the dry etching of the silicon insulating layer.

The oxide film may be made of silicon oxides ($SiO_2$). Moreover, oxides of transition metal such as $TiO_2$, $ZrO_2$, $HfO_2$, and $Ta_2O_5$ that are used as the material of the insulating layer may be used as the material of the oxide film.

In this connection, the oxide film may be formed by using a process which is known in the related art such as PECVD (Plasma Enhanced Chemical Vapor Deposition), a thermal evaporation process, an atomic layer deposition process, a chemical vapor deposition process, and an e-beam evaporation process.

In step (a), the silicon insulating layer is formed on the lower electrode.

The silicon insulating layer functions to electrically isolate light emitting pixels (RGB) from each other so that the light emitting pixels (RGB) are separately operated.

The silicon insulating layer may be made of amorphous silicon or polycrystalline silicon.

In this connection, the silicon insulating layer may be formed by using a process which is known in the related art such as PECVD (Plasma Enhanced Chemical Vapor Deposition), a thermal evaporation process, an atomic layer deposition process, a chemical vapor deposition process, and an e-beam evaporation process.

In step (b), the silicon insulating layer is dry etched to form the opening (light emission area) that ranges from the upper surface of the silicon insulating layer to the lower electrode.

A process of forming the opening may include patterning a photoresist in an area other than the dry-etching area for forming the opening in the upper surface of the silicon insulating layer, dry etching the dry-etching area, and removing the photoresist.

If the silicon insulating layer is dry etched, the overhang structure having the lowermost circumference that is larger than the uppermost circumference is formed in a lower area of the silicon insulating layer that is adjacent to the lower electrode, thereby forming the opening.

In the case where the silicon insulating layer is dry etched, examples of etching gas may include a gas mixture in which at least one gas selected from the group consisting of $Cl_2$, $BCl_3$, HBr, $NF_3$, $CF_4$, and $SF_6$ and at least one gas selected from the group consisting of He, $O_2$, and $H_2$ are mixed; or at least one gas selected from the group consisting of $Cl_2$, $BCl_3$, HBr, $NF_3$, $CF_4$, and $SF_6$. It is preferable that $Cl_2$ gas be used during the dry etching of the silicon insulating layer. In the case where the $Cl_2$ gas is used, as to an etching condition, preferably, the pressure is 500 mTorr, the power is 300 W, and the flow rate of $Cl_2$ is 100 sccm.

In the case where the silicon insulating layer is etched in order to form the opening in step (b), a notch is formed. The overhang structure may be formed by using the notch.

As to the notch, cations that are generated during the dry etching process, for example, a plasma dry etching process, are charged on the lower electrode, and a plasma is out of the straight due to the charged cations. Accordingly, the overhang structure is formed on a lower area of the silicon insulating layer.

Meanwhile, in the case where the silicon insulating layer is dry etched between the lower electrode and the silicon insulating layer, if the oxide film that functions to protect the lower electrode and to increase formation of the notch as described later during the dry etching of the silicon insulating layer is formed, the cations generated during the plasma dry etching process are charged on the oxide film on the lower electrode and the plasma is out of the straight due to the charged cations. Accordingly, the overhang structure is formed on the lower area of the silicon insulating layer (see FIG. 5).

In the case where the oxide film is formed between the lower electrode and the silicon insulating layer, step (b) may further include dry etching the oxide film after the silicon insulating layer is dry etched.

In the case where the oxide film is dry etched, a gas mixture in which at least one gas selected from the group consisting of $CF_4$, $CHF_3$, $NF_3$, $SF_6$, $BCl_3$, and HBr and at least one gas selected from the group consisting of He, $O_2$, and $H_2$ are mixed; or at least one gases selected from the group consisting of $CF_4$, $CHF_3$, $NF_3$, $SF_6$, $BCl_3$, and HBr may be used.

It is preferable that $CF_4$ be used during the dry etching of the oxide film. In the case where the $CF_4$ gas is used, as to an etching condition, preferably, the pressure is 50 mTorr, the power is 1200 W, the flow rate of $CHF_3$ is 70 sccm, and the flow rate of $O_2$ is 50 sccm. In the case where the oxide film is a transition metal oxide, preferably, $BCl_3$ or HBr is used as an etching gas. In the case where $BCl_3$ is used, as to an etching condition, preferably, the pressure is 500 mTorr, the power is 300 W, the flow rate of $BCl_3$ is 100 sccm, and the flow rate of He is 80 sccm.

In addition, in order to form the opening after the oxide film is dry etched, the photoresist may be removed from the upper surface of the silicon insulating layer can be removed.

In step (c), the conductive layer is formed on the upper surface of the lower electrode corresponding in position to the opening and the silicon insulating layer.

In order to prevent interference of movement of electrons due to formation of the oxide film on the surface of the lower electrode, a conductive material is deposited to form the conductive layer.

In this connection, it is preferable to use metal or an organic material having excellent conductivity as the conductive material.

For example, in the case where the lower electrode is made of aluminum, since the oxide film is naturally formed after the lower and the upper insulating layers are etched or due to exposure to the atmosphere, injection of electrons is interrupted, causing an increase in operation voltage and a rapid reduction in light emission efficiency. To avoid these problems, metal or the organic material having acceptable conductivity is deposited on the lower electrode and the upper portion of the insulating layer.

Examples of metal that is capable of being used to perform the deposition may include magnesium, calcium, sodium, potassium, titanium, indium, yttrium, lithium, gadolinium, aluminum, silver, tin, lead, or an alloy thereof.

Typically, a material that is used to form an electron injecting layer (EIL) and a hole injecting layer (HIL) may be used as an organic material having excellent conductivity. Alternatively, a complex of materials used to form an electron transporting layer (ETL) and the electron injecting layer or a hole transporting layer (HTL) and the hole injecting layer may be used.

In the case where an organic light emitting device having an inverted structure is manufactured, the conductive layer may be made of alkali metal, alkali earth metal, or a mixture thereof used to form the electron injecting layer. Alternatively, in the case where a normal structure is formed, the conductive layer may be made of the compound (hexanitril hexa-azatriphenylene, HAT) that is used to form the hole injecting layer and represented by the following Formula 1 (Korea Patent Application No. 10-2002-3025).

Formula 1

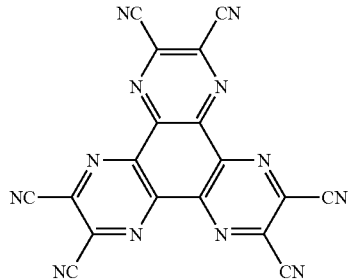

Alternatively, the conductive layer may be made of alkali metal, earth metal fluorides, and metal such as LiF, CsF, $CaF_2$, and $MgF_2$ that are used to form the electron injecting layer, or CuPc (Copper phthalocyanine) that is used to form the hole injecting layer.

In step (d), the organic material layer is formed on a portion of the conductive layer disposed on the upper surface of the lower electrode corresponding in position to the opening.

For example, the organic material layer may be formed in the opening by means of a vacuum deposition process using a deposition mask, or spin coating, dip coating, doctor blading, screen printing, inkjet printing, or a heat transferring process may be used.

The organic material layer may be formed of a single layer, or two or more layers, for example, a hole injecting layer, a hole transporting layer, a light emitting layer, and an electron transporting layer.

In step (e), the upper electrode is formed on the upper surface of the conductive layer disposed on the upper surface of the silicon insulating layer and the upper surface of the organic material layer.

For example, the upper electrode may be formed by using a process which is known in the related art such as a sputtering process, a thermal evaporation process, an atomic layer deposition process, a chemical vapor deposition process, and an e-beam evaporation process.

In this connection, the upper electrode may be made of transparent conducting oxides such as indium tin oxides (ITO), indium zinc oxides (IZO), and zinc oxides (ZnO), or metal such as magnesium, calcium, sodium, potassium, titanium, indium, yttrium, lithium, gadolinium, aluminum, silver, tin, and lead, or an alloy thereof. In the case where the present invention is applied to an organic light emitting device having an inverted structure, the upper electrode is made of transparent indium tin oxides (ITO).

In the method of manufacturing the organic light emitting device according to the first embodiment of the present invention, the overhang structure having the lowermost circumference that is larger than the uppermost circumference is formed at the lower area of the silicon insulating layer adjacent to the lower electrode by using the notch generated during the dry etching of the silicon insulating layer. Accordingly, it is possible to block a flowing path (see the arrow of FIG. 1) of a leakage current that flows along the surface direction of the conductive layer. Therefore, it is possible to prevent lighting of an undesired light emitting pixel caused by provision of the leakage current to the undesired light emitting pixel. Furthermore, the etching process is quickly performed through a simple procedure to form the overhang structure, and the size of overhang structure is easily controlled.

Meanwhile, an organic light emitting device according to another embodiment of the present invention includes a lower electrode, an insulating layer that is formed on the lower electrode and has an opening perpendicularly formed to a surface of the lower electrode. The opening has an overhang structure where a lowermost circumference is larger than an uppermost circumference. The organic light emitting device also includes a conductive layer that is formed on a surface of the insulating layer other than an upper surface of the lower electrode and the overhang structure in the opening, an organic material layer that is formed on the conductive layer formed on the upper surface of the lower electrode in the opening, and an upper electrode that is formed on an upper surface of the conductive layer disposed on the upper surface of the insulating layer and an upper surface of the organic material layer.

In this connection, an organic light emitting device according to the first embodiment of the present invention includes a lower electrode, a silicon insulating layer that is formed on the lower electrode and has an opening perpendicularly formed to a surface of the lower electrode. The opening has an overhang structure where a lowermost circumference is larger than an uppermost circumference. The organic light emitting device also includes a conductive layer that is formed on an upper surface of the lower electrode and the silicon insulating layer in the opening, an organic material layer that is formed on the conductive layer formed on the upper surface of the lower electrode in the opening, and an upper electrode that is formed on an upper surface of the conductive layer disposed on an upper surface of the silicon insulating layer and an upper surface of the organic material layer.

Meanwhile, an electronic device according to another embodiment of the present invention may include the organic light emitting device according to the present invention. The electronic device may be, for example, various types of display devices, but is not limited thereto.

Hereinafter, the organic light emitting device according to the first embodiment of the present invention and the method of manufacturing the organic light emitting device will be described in detail with reference to the accompanying drawings.

As shown in FIGS. 7 and 10, the organic light emitting device according to the first embodiment of the present invention includes a substrate (not shown), a lower electrode 20 that is formed on the substrate, a silicon insulating layer 40 that is formed on the lower electrode 20, openings 32a and 32b that range from an upper surface of the silicon insulating layer 40 to the lower electrode 20, conductive layers 50a and 50b that are formed on an upper surface of the lower electrode 20 in the openings 32a and 32b and the silicon insulating layer 40, an organic material layer 60 that is formed on the conductive layer 50a formed on the upper surface of the lower electrode 20 in the openings 32a and 32b, and an upper electrode 70 that is formed on an upper surface of the conductive layer 50b and an upper surface of the organic material layer 60. The organic light emitting device may further include an oxide film 30 that is interposed between the lower electrode 20 and the silicon insulating layer 40.

The lower electrode 20 is a cathode made of metal and the upper electrode 70 is an anode made of transparent indium tin oxide (ITO).

The conductive layers 50a and 50b are formed of a first conductive layer 50a that is formed on the lower electrode 20 in the openings 32a and 32b and a second conductive layer 50b that is formed on the upper surface of the silicon insulating layer 40 and an upper surface of a circumference portion of an upper area 32a of the openings 32a and 32b of the silicon insulating layer 40.

The organic material layer 60 is formed on the first conductive layer 50a in the openings 32a and 32b. Although not shown in FIG. 10, the organic material layer 60 may act as a hole injecting layer, a hole transporting layer, a light emitting layer, and an electron transporting layer.

The openings 32a and 32b are formed in the silicon insulating layer 40 and the oxide film 30 to range from the silicon insulating layer 40 through the oxide film 30 to the lower electrode 20.

An overhang structure 31 in which a lowermost circumference is larger than an uppermost circumference in the openings 32a and 32b is formed at the lower area of the silicon insulating layer 40 that is adjacent to the oxide film 30. Due to the overhang structure 31, the circumference of the lower area 32b is larger than the circumference of the upper area 32a in the openings 32a and 32b.

As shown in FIGS. 2 to 10, the method of manufacturing the organic light emitting device according to the first embodiment of the present invention includes (a) forming the silicon insulating layer 40 on the lower electrode 20, (b) dry etching the silicon insulating layer 40 to form the openings 32a and 32b ranging from the upper surface of the silicon insulating layer 40 to the lower electrode 20 so that the overhang structure having the lowermost circumference is larger than the uppermost circumference is formed, (c) forming the conductive layers 50a and 50b on the upper surface of the lower electrode 20 in the openings 32a and 32b and the silicon insulating layer 40, (d) forming the organic material layer 60 on the first conductive layer 50a formed on the upper surface of the lower electrode 20 in the openings 32a and 32b, and (e) forming the upper electrode 70 on an upper surface of the second conductive layer 50b and an upper surface of the organic material layer 60.

The method may further include forming the oxide film 30 on the lower electrode 20 before step (a), and dry etching the oxide film 30 after the silicon insulating layer 40 is dry etched in step (b).

As shown in FIG. 2, the oxide film 30 made of silicon oxide ($SiO_2$) is formed on the lower electrode 20.

As shown in FIG. 3, in step (a), the silicon insulating layer 40 made of amorphous silicon is formed on the oxide film 30.

As shown in FIG. 4, a photoresist 80 is patterned at an area other than a dry-etching area on which the openings 32a and 32b are to be formed on the upper surface of the silicon insulating layer 40.

In step (b), in the case where the silicon insulating layer 40 is dry etched by using the photoresist 80 as a mask by means of Cl$_2$ gas, as shown in FIG. 5, the overhang structure 31 is formed in the lower area of the silicon insulating layer 40.

Next, as shown in FIG. 6, the oxide film 30 is dry etched by using CF$_4$ gas and the photoresist 80 is then removed. Accordingly, as shown in FIG. 7, the openings 32a and 32b that range from the silicon insulating layer 40 through the oxide film 30 to the lower electrode 20 are formed.

In step (c), in order to form the conductive layers 50a and 50b, as shown in FIG. 7, a metal material or an organic material having conductivity is deposited thereon. Therefore, as shown in FIG. 8, the conductive layers 50a and 50b are formed only on the upper surface of the lower electrode 20 in the openings 32a and 32b, the upper surface of the silicon insulating layer 40, and walls of the upper area 32a of the openings 32a and 32b of the silicon insulating layer 40.

Since the overhang structure 31 is formed in the silicon insulating layer 40, the first conductive layer 50a that is formed on the upper surface of the lower electrode 20 in the openings 32a and 32b and the second conductive layer 50b that is formed on the upper surface of the silicon insulating layer 40 and the walls of the upper area 32a of the openings 32a and 32b are isolated from each other.

In step (d), as shown in FIG. 9, the organic material layer 60 is formed on the first conductive layer 50a formed on the upper surface of the lower electrode 20 in the openings 32a and 32b.

In step (e), as shown in FIG. 10, the upper electrode 70 is formed on the upper surface of the second conductive layer 50b and the upper surface of the organic material layer 60.

According to the above-mentioned manufacturing method, since the overhang structure 31 is formed by using the notch generated during the dry etching of the silicon insulating layer 40 disposed on the lower electrode 20, it is possible to block a flowing path (see the arrow of FIG. 1) of a leakage current that flows along the surface direction of the conductive layer 500. Therefore, it is possible to prevent lighting of an undesired light emitting pixel caused by provision of the leakage current to the undesired light emitting pixel along the surfaces direction of the conductive layers 50a and 50b.

Furthermore, the etching process is quickly performed through a simple procedure to form the overhang structure, and the size of overhang structure is easily controlled.

Hereinafter, a method of manufacturing an organic light emitting device according to a second embodiment of the present invention will be described.

In the method of manufacturing the organic light emitting device according to the second embodiment of the present invention, the insulating layer may include a lower insulating layer that is formed on the lower electrode and an upper insulating layer that is formed on the lower insulating layer to have an etching rate that is lower than that of the lower insulating layer.

Therefore, the method of manufacturing the organic light emitting device according to the second embodiment of the present invention includes (a) forming the lower insulating layer on the lower electrode, and forming the upper insulating layer having the etching rate that is lower than that of the lower insulating layer on the lower insulating layer, (b) etching the upper insulating layer and the lower insulating layer to form openings that ranges from the upper insulating layer through the lower insulating layer to the lower electrode so that an overhang structure where the circumference of the lower opening formed in the lower insulating layer is larger than the circumference of the upper opening formed in the upper insulating layer is formed, (c) forming the conductive layer on the upper surface of the lower electrode in the openings and the upper insulating layer, (d) forming the organic material layer on the conductive layer formed on the upper surface of the lower electrode in the openings, and (e) forming the upper electrode on an upper surface of the conductive layer formed on a surface of the upper insulating layer and an upper surface of the organic material layer.

In this connection, the method may further include forming the lower electrode on the substrate before step (a), and details of this step are as described in the first embodiment of the present invention.

In step (a), the lower insulating layer is formed on the lower electrode.

In the case where the conductive layer is formed by using metal or an organic material having conductivity in step (c) in order to easily inject electrons into the lower electrode, the lower insulating layer functions to block the leakage current flowing along the surface direction of the conductive layer.

It is preferable that the lower insulating layer be made of silicon oxide (SiO$_2$) having the etching rate that is higher than that of the upper insulating layer during the etching by using an etching solution. Additionally, the lower insulating layer may be made of SiON or amorphous Al$_2$O$_3$.

In this connection, the lower insulating layer may be formed by using a process which is known in the related art such as PECVD (Plasma Enhanced Chemical Vapor Deposition), a thermal evaporation process, an atomic layer deposition process, a chemical vapor deposition process, and an e-beam evaporation process.

In step (a), the upper insulating layer is formed on the lower insulating layer.

The lower insulating layer and the upper insulating layer function to electrically isolate light emitting pixels (RGB) from each other so that the light emitting pixels (RGB) are separately operated.

It is preferable that the upper insulating layer be made of Si$_3$N$_4$ having the etching rate that is lower than that of the lower insulating layer during the etching by using the etching solution.

In this connection, the upper insulating layer may be formed by using a process which is known in the related art such as PECVD (Plasma Enhanced Chemical Vapor Deposition), a thermal evaporation process, an atomic layer deposition process, a chemical vapor deposition process, and an e-beam evaporation process.

In step (b), the upper insulating layer and the lower insulating layer are etched to form the opening that ranges from the upper insulating layer through the lower insulating layer to the lower electrode.

In step (b), the opening (light emission area) that ranges from the upper insulating layer through the lower insulating layer to the lower electrode is formed by using the etching. In this connection, the overhang structure where the circumference of the lower opening formed in the lower insulating layer is larger than the circumference of the upper opening formed in the upper insulating layer is formed to prevent the leakage current from flowing along the surface direction of the conductive layer.

Specifically, after the upper insulating layer is dry etched, the lower insulating layer is wet etched by using the fact that the upper insulating layer and the lower insulating layer have different etching rates during the etching using the etching solution.

Alternatively, after the upper insulating layer and the lower insulating layer are dry etched, the lower insulating layer is wet etched by using the fact that the upper insulating layer and the lower insulating layer have different etching rates during the etching using the etching solution.

The above-mentioned dry etching is an isotropic etching method, and the upper insulating layer is etched by using an etching gas in the method.

For example, the etching may be performed by means of the etching gas where $CF_4$ and $O_2$ are mixed with each other by using the resist pattern that is formed on the upper insulating layer by a lithography process as a mask.

As to the dry etching condition, preferably, the pressure is 5 mTorr, the ICP power is 400 W, the bias power is 100 W, the flow rate of $CF_4$ is 45 sccm (standard cubic centimeter per minutes), and the flow rate of $O_2$ is 5 sccm.

Examples of the etching gas may include a gas mixture where $CHF_3$ gas, $O_2$ gas, and $CF_4$ gas are mixed with each other, a gas mixture where at least one gas selected from the group consisting of $O_2$ gas, $H_2$ gas, and He gas and $CF_4$ gas are mixed with each other; or at least one gas selected from the group consisting of $CF_4$ gas, $CHF_3$ gas, $C_2F_6$ gas, $C_3F_8$ gas, $SF_6$ gas, and $NF_3$ gas. Examples of the gas mixture may include $CF_4+H_2$ and $CF_4+He$.

The above-mentioned wet etching method is an anisotropic etching method. In the case where the etching is performed by means of the etching solution by using the fact that the etching rate of the lower insulating layer is higher than that of the upper insulating layer during the etching by using the etching solution, the overhang structure where the circumference of the lower opening formed in the lower insulating layer is larger than the circumference of the upper opening formed in the upper insulating layer is formed.

In this connection, examples of the etching solution may include a hydrofluoric acid (HF), a BOE (buffered oxide etchant), and a BHF (Buffered HF solution).

It is preferable that the overhang structure have curved surfaces which are etched surfaces of the lower insulating layer.

Preferably, the height of the lower insulating layer is 20 to 50 nm, and if the length of the straight line between both vertexes of the curved surface is considered the depth of the overhang structure, the depth of the overhang structure is 20 to 50 nm. Furthermore, it is preferable that the curved surface of the overhang structure be inclinedly formed in respects to the upper surface of the substrate at an angle of 30 to 45°.

Meanwhile, as described above, the wet etching is performed after the dry etching in order to form the overhang structure. However, the wet etching may be repeated twice. For example, the upper insulating layer may be wet etched by using a phosphoric acid ($H_3PO_4$) and the lower insulating layer may be wet etched by using a hydrofluoric acid (HF).

In step (c), the conductive layer is formed on the upper surface of the lower electrode and the upper insulating layer in the opening. Details of this step are as described in the first embodiment of the present invention.

In step (d), the organic material layer is formed on the conductive layer formed on the upper surface of the lower electrode in the opening. Details of this step are as described in the first embodiment of the present invention.

In step (e), the upper electrode is formed on the upper surface of the conductive layer formed on the upper surface of the upper insulating layer and the upper surface of the organic material layer. Details of this step are as described in the first embodiment of the present invention.

In the method of manufacturing the organic light emitting device according to the second embodiment of the present invention, as to the opening that ranges from the upper insulating layer and the lower insulating layer to the lower electrode, the overhang structure where the circumference of the lower opening formed in the lower insulating layer is larger than the circumference of the upper opening formed in the upper insulating layer is formed. Accordingly, it is possible to block a flowing path (see the arrow of FIG. 1) of a leakage current that flows along the surface direction of the conductive layer. Therefore, it is possible to prevent lighting of an undesired light emitting pixel caused by provision of the leakage current to the undesired light emitting pixel.

The organic light emitting device according to the second embodiment of the present invention includes the lower electrode, the lower insulating layer that is formed on the lower electrode and has the lower opening, the upper insulating layer that is formed on the lower insulating layer and has the upper opening communicating with the lower opening to have the circumference that is smaller than that of the lower opening so that the upper insulating layer forms the overhang structure in conjunction with the lower insulating layer, the conductive layer that is formed on the upper surface of the lower electrode in the lower opening and the upper insulating layer, the organic material layer that is formed on the conductive layer formed on the upper surface of the lower electrode in the lower opening, and the upper electrode that is formed on an upper surface of the conductive layer disposed on an surface of the upper insulating layer and an upper surface of the organic material layer.

Hereinafter, the organic light emitting device according to the second embodiment of the present invention and the method of manufacturing the organic light emitting device will be described in detail with reference to the accompanying drawings.

As shown in FIGS. 11 and 16, the organic light emitting device according to the second embodiment of the present invention includes a substrate (not shown), a lower electrode 120 that is formed on the substrate (not shown), a lower insulating layer 130 that is formed on the lower electrode 120 and has a lower opening 132a, an upper insulating layer 140 that is formed on the lower insulating layer 130 and has an upper opening 132b communicating with the lower opening 132a to have the circumference that is smaller than that of the lower opening 132a so that the upper insulating layer forms an overhang structure 131 in conjunction with the lower insulating layer 130, conductive layers 150a and 150b that are formed on the upper surface of the lower electrode 120 in the lower opening 132a and the upper insulating layer 140, an organic material layer 160 that is formed on the conductive layer 150a formed on the upper surface of the lower electrode 120 in the lower opening 132a, and an upper electrode 170 that is formed on an upper surface of the conductive layer 150b disposed on an surface of the upper insulating layer 140 and an upper surface of the organic material layer 160.

The substrate may be made of transparent plastics, or metal such as gold, silver, aluminum, and an alloy thereof.

The lower electrode 120 is a cathode made of metal and the upper electrode 170 is an anode made of transparent indium tin oxides (ITO).

The conductive layers 150 includes the first conductive layer 150a that is formed on the lower electrode 120 in the openings 132a and 132b and the second conductive layer 150b that is formed on the upper surface of the upper insulating layer 140 and a wall of the upper opening 132b of the upper insulating layer 140.

In this connection, the conductive layer is preferably made of a metal material or an organic material having excellent conductivity.

The organic material layer 160 is formed on the first conductive layer 150a in the openings 132a and 132b. Although not shown in FIG. 11, the organic material layer 160 may act as a hole injecting layer, a hole transporting layer, a light emitting layer, and an electron transporting layer.

The insulating layers 130 and 140 include the lower insulating layer 130 that is formed on the lower electrode 120, the upper insulating layer 140 that is formed on the lower insulating layer 130, and the openings 132a and 132b that range from the upper insulating layer 140 through the lower insulating layer 130 to the lower electrode 120.

The lower insulating layer 130 is made of silicon oxide ($SiO_2$) that has the etching rate higher than that of the upper insulating layer 140 during the etching by using the etching solution, and the upper insulating layer 140 is made of silicon nitride ($Si_3N_4$) that has the etching rate lower than that of the lower insulating layer 130.

The openings 132a and 132b include the lower opening 132a that is formed in the lower insulating layer 130 and the upper opening 132b that has the circumference smaller than that of the lower opening 132a and is formed in the upper insulating layer 140.

Additionally, as to the openings 132a and 132b, an overhang structure 131 where the circumference of the lower opening 132a formed in the lower insulating layer 130 is larger than the circumference of the upper opening 132b formed in the upper insulating layer 140 is formed. In the overhang structure 131, the surface of the wall formed by the etching so that the circumference of the lower opening 132a is larger than the circumference of the upper opening 132b is a curved surface curved so that the diameter gradually increases as moving from an upper portion of the upper opening to a lower portion of the lower opening at the center of the openings 132a and 132b.

As shown in FIGS. 12 to 19, the method of manufacturing the organic light emitting device according to the second embodiment of the present invention includes (a) forming the lower insulating layer 130 on the lower electrode 120 and forming the upper insulating layer 140 having the etching rate that is lower than that of the lower insulating layer 130 on the lower insulating layer 130, (b) etching the upper insulating layer 140 and the lower insulating layer 130 to form the openings 132a and 132b that range from the upper insulating layer 140 through the lower insulating layer 130 to the lower electrode 120, (c) forming the conductive layers 150a and 150b on the upper surface of the lower electrode 120 in the openings 132a and 132b and the upper insulating layer 140, (d) forming the organic material layer 160 on the conductive layer 150a formed on the upper surface of the lower electrode 120 in the openings 132a and 132b, and (e) forming the upper electrode 170 on an upper surface of the conductive layer 150b formed on an surface of the upper insulating layer 140 and an upper surface of the organic material layer 160.

The process in which the thin film is deposited on the substrate to form the lower electrode 120 and then patterned to form the lower electrode 120 on the substrate is not shown in the drawings.

As shown in FIG. 12, in step (a), the lower insulating layer 130 made of silicon oxide ($SiO_2$) is formed on the lower electrode 120.

As shown in FIG. 13, in step (a), the upper insulating layer 140 made of silicon nitride ($Si_3N_4$) that has the etching rate lower than that of the lower insulating layer 130 is formed on the lower insulating layer 130.

In step (b), the upper insulating layer 140 and the lower insulating layer 130 are etched to form the openings 132a and 132b that range from the upper insulating layer 140 through the lower insulating layer 130 to the lower electrode 120.

Specifically, as shown in FIG. 14, the upper insulating layer 140 and the lower insulating layer 130 are dry etched by using a resist pattern (not shown) formed on the upper insulating layer 140 as a mask by means of an etching gas mixture of $CF_4$ and $O_2$.

Furthermore, if the lower insulating layer 130 is wet etched by using the fact that the upper insulating layer 140 and the lower insulating layer 130 have different etching rates during the etching using the etching solution, as shown in FIG. 15, in respects to the openings 132a and 132b, the overhang structure where the circumference of the lower opening 132a formed in the lower insulating layer 130 is larger than the circumference of the upper opening 132b formed in the upper insulating layer 140 is formed.

Alternatively, as shown in FIG. 19, after the upper insulating layer 140 is dry etched, the lower insulating layer 130 is wet etched by using the fact that the upper insulating layer 140 and the lower insulating layer 130 have different etching rates during the etching using the etching solution, thereby forming the overhang structure.

In step (c), as shown in FIG. 15, a metal material or an organic material having conductivity is deposited thereon. Therefore, as shown in FIG. 16, the conductive layers 150a and 150b are formed only on the upper surface of the lower electrode 120 in the openings 132a and 132b, the upper surface of the upper insulating layer 140, and a wall of the upper opening 132b of the upper insulating layer 140.

Since the overhang structure 131 is formed, the first conductive layer 150a that is formed on the upper surface of the lower electrode 120 in the openings 132a and 132b and the second conductive layer 150b that is formed on the upper surface of the upper insulating layer 140 and the walls of the upper opening 132b are isolated from each other.

In step (d), as shown in FIG. 17, the organic material layer 160 is formed on the first conductive layer 150a formed on the upper surface of the lower electrode 120 in the openings 132a and 132b.

In step (e), as shown in FIG. 18, the upper electrode 170 is formed on the upper surface of the second conductive layer 150b and the upper surface of the organic material layer 160.

In the method of manufacturing the organic light emitting device according to the second embodiment of the present invention, in respects to the openings 132a and 132b, the overhang structure 131 where the circumference of the lower opening 132a formed in the lower insulating layer 130 is larger than the circumference of the upper opening 132b formed in the upper insulating layer 140 is formed. Accordingly, a flowing path (see the arrow of FIG. 1) of a leakage current that flows along the surface direction of the conductive layer 500 is blocked. Therefore, it is possible to prevent lighting of an undesired light emitting pixel caused by provision of the leakage current to the undesired light emitting pixel along the surface direction of the conductive layers 150a and 150b.

The invention claimed is:

1. A method of manufacturing an organic light emitting device, comprising the steps of:
   (a) forming an insulating layer on a lower electrode;
   (b) etching the insulating layer to form an opening ranging from an upper surface of the insulating layer to the lower electrode so that an overhang structure having a lowermost circumference that is larger than an uppermost circumference is formed;
   (c) forming a conductive layer on an upper surface of the lower electrode in the opening and a surface of the insulating layer other than the overhang structure;
   (d) forming an organic material layer on the conductive layer formed on the upper surface of the lower electrode in the opening; and (e) forming an upper electrode on an upper surface of the conductive layer disposed on the surface of the insulating layer and an upper surface of the organic material layer, wherein the insulating layer includes a lower insulating layer that is formed on the lower electrode and an upper insulating layer that is formed on the lower insulating layer to have an etching rate that is lower than an etching rate of the lower insulating layer, the upper insulating layer and the lower insulating layer are etched to form openings that ranges from the upper insulating layer through the lower insulating layer to the lower electrode so that an overhang structure where a circumference of a lower opening formed in the lower insulating layer is larger than a circumference of an upper opening formed in the upper insulating layer is formed in step (b), and the overhang structure has a curved surface curved so that a diameter gradually increases as moving from an upper portion of the upper opening to a lower portion of the lower opening.

2. The method of manufacturing an organic light emitting device according to claim 1, wherein the insulating layer is a silicon insulating layer, and the etching of the insulating layer is performed by using dry etching in step (b).

3. The method of manufacturing an organic light emitting device according to claim 2, wherein the silicon insulating layer is made of amorphous silicon.

4. The method of manufacturing an organic light emitting device according to claim 2, wherein a photoresist is patterned in an area other than a dry-etching area for forming an opening in an upper surface of the silicon insulating layer, the dry-etching area is dry etched, and the photoresist is removed to form the opening in step (b).

5. The method of manufacturing an organic light emitting device according to claim 2, further comprising:
forming an oxide film on the lower electrode before step (a); and
dry etching the oxide film after the dry etching of the silicon insulating layer in step (b).

6. The method of manufacturing an organic light emitting device according to claim 5, wherein the oxide film is made of any one of $SiO_2$, $TiO_2$, $ZrO_2$, $HfO_2$, and $Ta_2O_5$.

7. The method of manufacturing an organic light emitting device according to claim 1, wherein the lower insulating layer is made of any one selected from the group consisting of SiON, amorphous $Al_2O_3$, and $SiO_2$, and the upper insulating layer is made of $Si_3N_4$.

8. The method of manufacturing an organic light emitting device according to claim 1, wherein in step (b), after the upper insulating layer is dry etched to form the upper opening, the lower insulating layer is wet etched by using the fact that the upper insulating layer and the lower insulating layer have different etching rates during etching using an etching solution, thereby forming the overhang structure where the circumference of the lower opening is larger than the circumference of the upper opening.

9. The method of manufacturing an organic light emitting device according to claim 1, wherein in step (b), after the upper insulating layer and the lower insulating layer are dry etched, the lower insulating layer is wet etched by using the fact that the upper insulating layer and the lower insulating layer have different etching rates during etching using an etching solution, thereby forming the overhang structure where the circumference of the lower opening is larger than the circumference of the upper opening.

10. The method of manufacturing an organic light emitting device according to claim 1, wherein in step (b), the upper insulating layer and the lower insulating layer are wet etched by using the fact that the upper insulating layer and the lower insulating layer have different etching rates during etching using an etching solution, thereby forming the overhang structure where the circumference of the lower opening is larger than the circumference of the upper opening.

11. The method of manufacturing an organic light emitting device according to claim 10, wherein the upper insulating layer is wet etched by using a phosphoric acid ($H_3PO_4$) and the lower insulating layer is wet etched by using a hydrofluoric acid (HF).

12. An organic light emitting device comprising:
a lower electrode;
an insulating layer that is formed on the lower electrode and has an opening perpendicularly formed to a surface of the lower electrode, the opening having an overhang structure where a lowermost circumference is larger than an uppermost circumference;
a conductive layer that is formed on an upper surface of the lower electrode in the opening and a surface of the insulating layer other than the overhang structure;
an organic material layer that is formed on the conductive layer formed on the upper surface of the lower electrode in the opening; and
an upper electrode that is formed on an upper surface of the conductive layer disposed on the surface of the insulating layer and an upper surface of the organic material layer,
wherein the insulating layer having the overhang structure includes a lower insulating layer that is formed on the lower electrode and an upper insulating layer that is formed on the lower insulating layer,
the opening includes a lower opening that is formed in the lower insulating layer and an upper opening that is formed in the upper insulating layer to communicate with the lower opening and has the circumference smaller than the circumference of the lower opening so that the overhang structure is formed, and
the overhang structure has a curved surface curved so that a diameter gradually increases as moving from an upper portion of the upper opening to a lower portion of the lower opening.

13. The organic light emitting device according to claim 12, wherein the insulating layer is a silicon insulating layer.

14. The organic light emitting device according to claim 13, wherein the silicon insulating layer is made of amorphous silicon.

15. The organic light emitting device according to claim 13, further comprising an oxide film that is interposed between the lower electrode and the silicon insulating layer.

16. The organic light emitting device according to claim 15, wherein the oxide film is made of any one of $SiO_2$, $TiO_2$, $ZrO_2$, $HfO_2$, and $Ta_2O_5$.

17. The organic light emitting device according to claim 12, wherein the lower insulating layer is made of any one selected from the group consisting of SiON, amorphous $Al_2O_3$, and $SiO_2$, and the upper insulating layer is made of $Si_3N_4$.

18. The organic light emitting device according to claim 12, wherein the lower insulating layer and the upper insulating layer have different etching rates during etching using an etching solution, and the lower insulating layer has the etching rate that is higher than the etching rate of the upper insulating layer.

19. The organic light emitting device according to claim 12, wherein the overhang structure is formed by wet etching both the upper insulating layer and the lower insulating layer.

20. The organic light emitting device according to claim 19, wherein an etching solution that is used to perform wet etching of the upper insulating layer is a phosphoric acid ($H_3PO_4$), and the etching solution that is used to perform wet etching of the lower insulating layer is a hydrofluoric acid (HF).

21. The organic light emitting device according to claim 12, wherein the overhang structure is formed by wet etching the lower insulating layer by using an etching solution after the upper insulating layer is dry etched.

22. The organic light emitting device according to claim 12, wherein the overhang structure is formed by wet etching the lower insulating layer by using an etching solution after the upper insulating layer and the lower insulating layer are dry etched.

* * * * *